US008257596B2

(12) United States Patent
Mather et al.

(10) Patent No.: US 8,257,596 B2
(45) Date of Patent: Sep. 4, 2012

(54) TWO-AXIS MAGNETIC FIELD SENSOR WITH SUBSTANTIALLY ORTHOGONAL PINNING DIRECTIONS

(75) Inventors: Phillip G. Mather, Maricopa, AZ (US); Jon M. Slaughter, Tempe, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 777 days.

(21) Appl. No.: 12/433,679

(22) Filed: Apr. 30, 2009

(65) Prior Publication Data

US 2010/0276389 A1    Nov. 4, 2010

(51) Int. Cl.
B44C 1/22     (2006.01)
G08B 17/12    (2006.01)
(52) U.S. Cl. .................... 216/22; 340/600; 29/602.1
(58) Field of Classification Search .................. None
See application file for complete search history.

(56) References Cited

U.S. PATENT DOCUMENTS

| 6,462,541 | B1  | 10/2002 | Wang et al. |
| 6,818,961 | B1  | 11/2004 | Rizzo et al. |
| 6,967,366 | B2  | 11/2005 | Janesky et al. |
| 7,095,646 | B2  | 8/2006  | Slaughter et al. |
| 7,965,077 | B2* | 6/2011  | Engel et al. ............ 324/252 |
| 2003/0048676 | A1* | 3/2003 | Daughton et al. ........ 365/200 |
| 2004/0120184 | A1 | 6/2004 | Janesky et al. |
| 2004/0137275 | A1 | 7/2004 | Jander et al. |
| 2006/0077707 | A1* | 4/2006 | Deak ........................ 365/171 |
| 2009/0087589 | A1 | 4/2009 | Guo et al. |
| 2009/0279212 | A1* | 11/2009 | Engel et al. ............ 360/314 |
| 2010/0276389 | A1* | 11/2010 | Mather et al. ............ 216/22 |
| 2012/0049843 | A1* | 3/2012  | Sun et al. ................ 324/249 |

OTHER PUBLICATIONS

International Search Report for PCT/US10/031378 mailed Jun. 4, 2010.
U.S. Appl. No. 12/117,396, filed May 8, 2008.
International Preliminary Report on Patentability issued Nov. 10, 2011 in PCT/US2010/031378.

* cited by examiner

Primary Examiner — Allan Olsen
(74) Attorney, Agent, or Firm — Ingrassia Fisher & Lorenz, P.C.

(57) ABSTRACT

A fabrication process and apparatus provide a high-performance magnetic field sensor (200) from two differential sensor configurations (201, 211) which require only two distinct pinning axes (206, 216) which are formed from a single reference layer (60) that is etched into high aspect ratio shapes (62, 63) with their long axes drawn with different orientations so that, upon treating the reference layer with a properly aligned orienting field (90) and then removing the orienting field, the high aspect ratio patterns provide a shape anisotropy that forces the magnetization of each patterned shape (62, 63) to relax along its respective desired axis. Upon heating and cooling, the ferromagnetic film is pinned in the different desired directions by one of 1) tailoring the intrinsic anisotropy of the reference layer during the depositing step, 2) forming a long axes of one of the patterned shapes (62, 63) at a non-orthogonal angle to the long axes of the other patterned shape (62, 63) when etched, or 3) applying a compensating field when pinning the reference layers.

16 Claims, 7 Drawing Sheets

→ FIXED (REFERENCE) LAYER MAGNETIZATION DIRECTION
⇨ PINNED (LARGE MOMENT) LAYER MAGNETIZATION DIRECTION

TWO-AXIS MAGNETIC FIELD SENSOR WITH SUBSTANTIALLY ORTHOGONAL PINNING DIRECTIONS

CROSS REFERENCE TO RELATED APPLICATION

This application is related to pending application Ser. No. 12/117,396, filed 8 May 2008.

FIELD

The present invention generally relates to the field of magnetoelectronic devices and more particularly to CMOS-compatible magnetoelectronic field sensors used to sense magnetic fields.

BACKGROUND

Sensors are widely used in modern systems to measure or detect physical parameters, such as position, motion, force, acceleration, temperature, pressure, etc. While a variety of different sensor types exist for measuring these and other parameters, they all suffer from various limitations. For example, inexpensive low field sensors, such as those used in an electronic compass and other similar magnetic sensing applications generally consist of anisotropic magnetoresistance (AMR) based devices. In order to arrive at the required sensitivity and reasonable resistances that mesh well with CMOS, the sensing units of such sensors are generally in the order of square millimeters in size. For mobile applications, such AMR sensor configurations are costly, in terms of expense, circuit area, and power consumption.

Other types of sensors, such as magnetic tunnel junction (MTJ) sensors and giant magnetoresistance (GMR) sensors, have been used to provide smaller profile sensors, but such sensors have their own concerns, such as inadequate sensitivity and being effected by temperature changes. To address these concerns, MTJ sensors and GMR sensors have been employed in a Wheatstone bridge structure to increase sensitivity and to eliminate temperature dependent resistance changes. Indeed, two-axis magnetic field sensors have been developed for electronic compass applications to detect the earth's field direction by using a Wheatstone bridge structure for each sense axis. However, such field sensors typically include two opposite pinning directions for each sense axis, resulting in four different pinning directions which must be individually set for each circuit utilizing a magnet array with complex and unwieldy magnetization techniques, or employ a thick NiFe shield/flux concentrating layer to direct the local direction of a lower intermediate field requiring additional process complexity. Another method to achieve different reference layer magnetization directions is to deposit two different anti-ferromagnetic layers with different blocking temperatures and to apply a complicated setting procedure and a difficult process flow to set two different pinning directions and to make contact to the two different sensor orientations.

Accordingly, a need exists for an improved sensor design and fabrication process for forming reference layers with substantially orthogonal magnetization directions. There is also a need for a dual-axis sensor that can be efficiently and inexpensively constructed as an integrated circuit structure for use in mobile applications. There is also a need for an improved magnetic field sensor and fabrication to overcome the problems in the art, such as outlined above. Furthermore, other desirable features and characteristics of the present invention will become apparent from the subsequent detailed description and the appended claims, taken in conjunction with the accompanying drawings and this background.

BRIEF DESCRIPTION OF THE DRAWINGS

Embodiments of the present invention will hereinafter be described in conjunction with the following drawing figures, wherein like numerals denote like elements.

Figure 1:
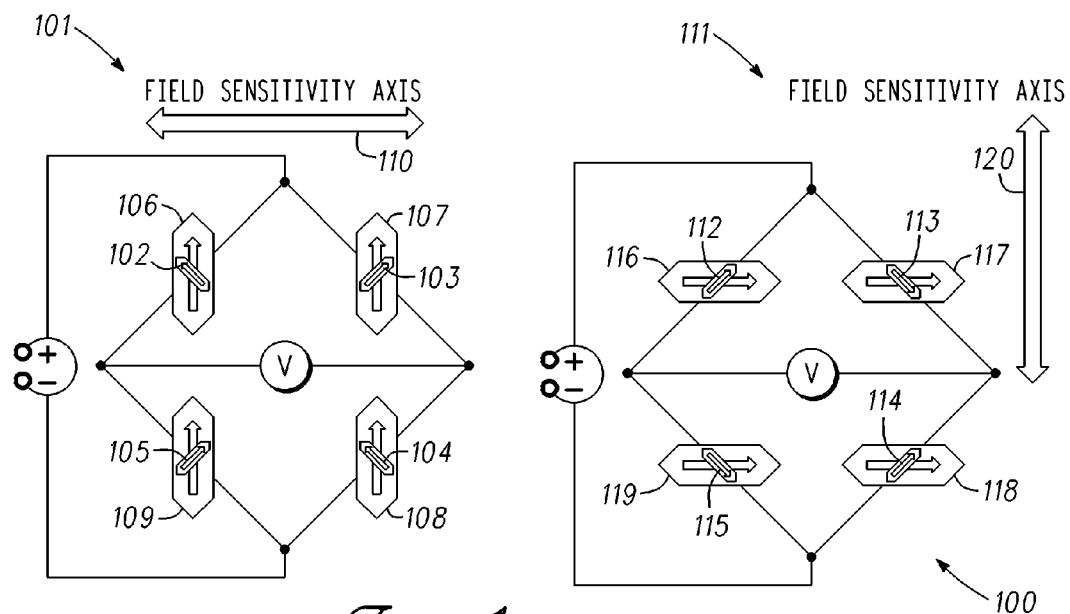
FIG. 1 illustrates an electronic compass structure which uses differential sensors formed from two bridge structures with unshielded MTJ sensors.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

A method and apparatus are described for providing multi-axis pinning on a bulk wafer which may be used to form an integrated circuit sensor with different reference layers having substantially orthogonal pinning directions that are set with a single pinning material deposition and bulk wafer setting procedure. As a preliminary step, a stack of one or more layers of ferromagnetic and antiferromagnetic materials are etched into shaped reference layers having a two-dimensional shape with a high aspect ratio, where the shape provides a distinction for the desired magnetization direction for each reference layer. Depending on the materials and techniques used, the final magnetization direction may be oriented along the short axis or the long axis of the shaped layer. For example, if the pinned layer is formed with a slightly imbalanced synthetic anti-ferromagnet (SAF) patterned into micron-scale dimensions, the magnetization will direct along the short axis. As will be appreciated by those skilled in the art, the SAF embodiment provides a number of benefits related to the use of pinned-SAF reference layers in magnetoelectronic devices. In other embodiments, by controlling the thicknesses of the free and fixed layers, the final magnetization may be directed along the long axis. Using shape anisotropy, different magnetization directions are induced in the reference layers by heating in the presence of an orienting field that is aligned between the desired magnetization directions for the reference layers. In selected embodiments, the reference layers are heated sufficiently to reduce the material component of the anisotropy and allow the shape and external field to dominate the magnetization direction. In this manner, once the orienting field is removed, the shape anisotropy directs the magnetization in the desired direction. Upon removing the orienting field, the magnetizations of the reference layers relax to follow the shape of the reference layers so as to induce a magnetization that is aligned along the desired axis of the shaped reference layer and later pinned as the anneal temperature is reduced. For example, if two reference layers are shaped to have longer dimensions which are perpendicular to one another, then the induced magnetizations for the two reference layers will be close to being perpendicular to one another.

However, there are additional sources beyond the shape anisotropy that influence the magnetization of the reference layers and thus determine the final pinning direction. While the pinning steps take place at high temperature, thereby reducing the intrinsic anisotropy of the deposited ferromagnetic layers, a finite anisotropy is still present with a defined direction which competes with the shape anisotropy of the patterned reference layer. Also, due to field cycling over time, the support structure and/or pole pieces for the magnet oven utilized in the pinning anneal may become magnetized, applying a small residual field even in the absence of magnetizing current. This residual field will interact with the reference layer magnetization, and may be either zeroed out or overcome to create a small compensating field with a field that is applied in a direction to oppose this remnant field. Additionally, similar to the distribution of pinning strengths present in any real pinned ferromagnetic layer, there exists a local distribution in the temperature required to pin the ferromagnetic layer. This allows high temperature steps, that occur prior to the pinning anneal, to create a low level of local pinning sites that may influence the direction of the magnetization during the pinning anneal. Therefore competition between the intrinsic anisotropy, shape anisotropy, low level of early pinning, and a small remnant field present during the pinning anneal prevent a true orthogonal setting of the induced magnetizations. For accurate elimination of soft Fe effects in the final device, a true orthogonal setting is desired as any simple calibration for soft Fe effects will lose accuracy if non-orthogonalities are also present. This true orthogonal setting may be accomplished by one or more of: 1) Tailoring the intrinsic anisotropy of the reference layer material by applying a field direction during the deposition to induce an anisotropy direction that is different from that used during the setting procedure. A similar method to tailor the intrinsic anisotropy is to apply an alternating field during the deposition of the magnetic layers in order to remove the possibility of introducing a low level of magnetic pinning in the pinned layer during the high energy deposition of the ferromagnetic layers, which will counteract the desired pinning direction during the magnetic field anneal. A third tailoring possibility is to produce a rotating field during the deposition of the magnetic material to remove any preferred anisotropy direction. 2) Applying a small field during the pinning portion of the magnetic anneal to either eliminate the residual field in the magnet or to provide a slight negative net field for proper compensation of the intrinsic anisotropy. 3) Forming the reference layers with a non-orthogonal axis wherein the final resultant setting direction is truly orthogonal.

If the reference layers have not been annealed above the pinning temperature (which is the lower of either the antiferromagnetic blocking temperature or the antiferromagnetic crystalline phase formation temperature) of the antiferromagnet, then a single anneal process is applied to set the induced magnetizations for the two reference layers. With this approach, a single pinning material deposition step and a single anneal step are performed to set all induced magnetizations for the reference layers without requiring additional magnetic layers, thereby providing a bulk wafer setting procedure that simplifies and reduces the manufacturing cost and complexity, as compared to previously known methods utilizing either two different antiferromagnetic pinning layers or a magnetic array to set the pinning directions. The simplified process for forming reference layers with different pinned directions allows independent magnetic sensor elements to be formed at a minimal spacing within the sensor die, and as a result, different sensor configurations within a single die of minimal area can have different sensitive axes.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, selected aspects are depicted with reference to simplified cross sectional drawings without including every device feature or geometry in order to avoid limiting or obscuring the present invention. It is also noted that, throughout this detailed description, conventional techniques and features related to magnetic sensor design and operation, Magnetoresistive Random Access Memory (MRAM) design, MRAM operation, semiconductor device fabrication, and other aspects of the integrated circuit devices may not be described in detail herein. While certain materials will be formed and removed to fabricate the integrated circuit sensors as part of an existing MRAM fabrication process, the specific procedures for forming or removing such materials are not detailed below since such details are well known and not considered necessary to teach one skilled in the art of how to make or use the present invention. Furthermore, the circuit/component layouts and configurations shown in the various figures contained herein are intended to represent exemplary embodiments of the invention. It should be noted that many alternative or additional circuit/component layouts may be present in a practical embodiment.

FIG. 1 shows a magnetic field sensor 100 formed with first and second differential sensors 101, 111 for detecting the component directions of an applied field along a first axis 120 (e.g., the y-axis direction) and a second axis 110 (e.g., the x-axis direction), respectively. As depicted, each sensor 101, 111 is formed with unshielded sense elements that are connected in a bridge configuration. Thus, the first sensor 101 is formed from the connection of a plurality of sense elements 102-105 in a bridge configuration over a corresponding plurality of pinned layers 106-109, where each of the pinned layers 106-109 is magnetized in the y-axis direction. In similar fashion, the second sensor 111 is formed from the connection of a plurality of sense elements 112-115 in a bridge configuration over a corresponding plurality of pinned layers 116-119 that are each magnetized in the x-axis direction that is perpendicular to the magnetization direction of the pinned layers 106-109. In the depicted bridge configuration 101, the sense elements 102, 104 are formed to have a first easy axis magnetization direction and the sense elements 103, 105 are formed to have a second easy axis magnetization direction, where the first and second easy axis magnetization directions are orthogonal with respect to one another and are oriented to differ equally from the magnetization direction of the pinned layers 106-109. As for the second bridge configuration 111, the sense elements 112, 114 have a first easy axis magnetization direction that is orthogonal to the second easy axis magnetization direction for the sense elements 113, 115 so that the first and second easy axis magnetization directions are oriented to differ equally from the magnetization direction of the pinned layers 116-119. In the depicted sensors 101, 111, there is no shielding required for the sense elements, nor are any special reference elements required. In an exemplary embodiment, this is achieved by referencing each active sense element (e.g., 102, 104) with another active sense element (e.g., 103, 105) using shape anisotropy techniques to establish the easy magnetic axes of the referenced sense elements to be deflected from each other by 90 degrees. The configuration shown in FIG. 1 is not required to harvest the benefits of the dual axis pinning technique, and is only given as an example. For example, thin shields may also be used to suppress the sensor response of two of four identical sensor elements to achieve a differential response.

By positioning the first and second sensors 101, 111 to be orthogonally aligned, each with the sense element orientations deflected equally from the sensor's pinning direction and orthogonal to one another in each sensor, the sensors can detect the component directions of an applied field along the first and second axes.

As seen from the foregoing, a magnetic field sensor may be formed from differential sensors 101, 111 which use unshielded sense elements 102-105, 112-115 connected in a bridge configuration over respective pinned layers 106, 116 to detect the presence and direction of an applied magnetic field. With this configuration, the magnetic field sensor provides good sensitivity, and also provides the temperature compensating properties of a bridge configuration.

Figure 2:
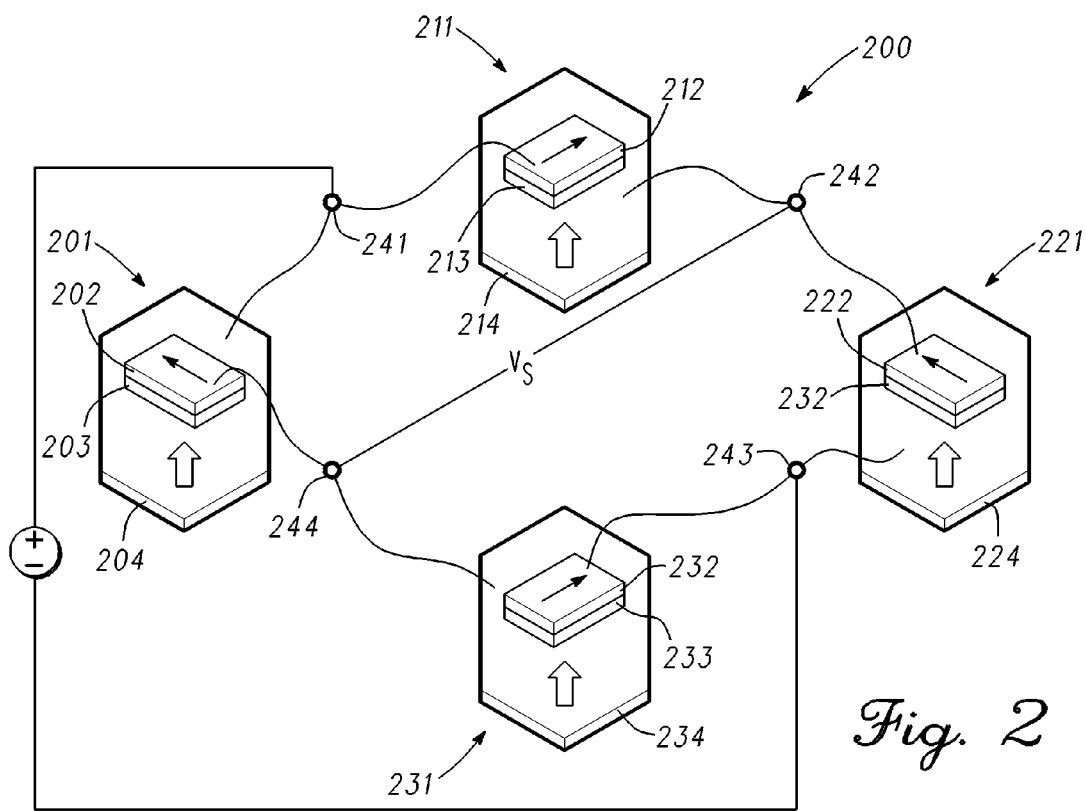
FIG. 2 provides a simplified schematic perspective view of an exemplary field sensor formed by connecting four MTJ sensors in a Wheatstone bridge circuit.

To provide additional insight into the structure and formation of the magnetic field sensor of the exemplary embodiments, FIG. 2 provides a simplified schematic perspective view of an exemplary field sensor 200 formed by connecting four MTJ sense elements 201, 211, 221, 231 in a Wheatstone bridge circuit. The bridge circuit may be manufactured as part of an existing MRAM or thin-film sensor manufacturing process with only minor adjustments to control the magnetic orientation of the various sensor layers. In particular, the depicted MTJ sensors 201, 211, 221, 231 are formed with pinned reference layers 204, 214, 224, 234 that are each magnetically aligned in a single pinning direction, and with sense layers 202, 212, 222, 232 that are aligned to have different magnetization directions from the magnetization direction of the pinned layers 204, 214, 224, 234. As formed, each MTJ sensor (e.g., 201) includes a pinned electrode 204 formed with one or more lower ferromagnetic layers, an insulating tunneling dielectric layer 203, and a sense electrode 202 formed with one or more upper ferromagnetic layers. The pinned and sense electrodes are desirably magnetic materials whose magnetization direction can be aligned. Suitable electrode materials and arrangements of the materials into structures commonly used for electrodes of magnetoresistive random access memory (MRAM) devices and other MTJ sensor devices are well known in the art. For example, the lower layer 204, 214, 224, 234 may be formed with one or more layers of ferromagnetic and antiferromagnetic materials to a combined thickness in the range 10 to 1000 Å, and in selected embodiments in the range 200 to 300 Å. In an exemplary implementation, each of the pinned layers (e.g., 204, 214, 224, 234) is formed with a single ferromagnetic layer and an underlaying anti-ferromagnetic pinning layer. In another exemplary implementation, each pinned layer (e.g., 204) includes a ferromagnetic stack component (e.g., a stack of CFB (Cobalt Fe Boron), Ruthenium (Ru) and CFB) which is 20 to 80 Å thick, and an underlying anti-ferromagnetic pinning layer that is approximately 200 Å thick. The lower anti-ferromagnetic pinning materials may be re-settable materials, such as IrMn, though other materials, such as PtMn, can be used which are not readily re-set at reasonable temperatures. As formed, the pinned reference layers function as a fixed or pinned magnetic layer when the direction of its magnetization is pinned in one direction that does not change during normal operating conditions. As disclosed herein, the heating qualities of the materials used to pin the reference layers 204, 214, 224, 234 can change the fabrication sequence used to form these layers.

Figure 3:
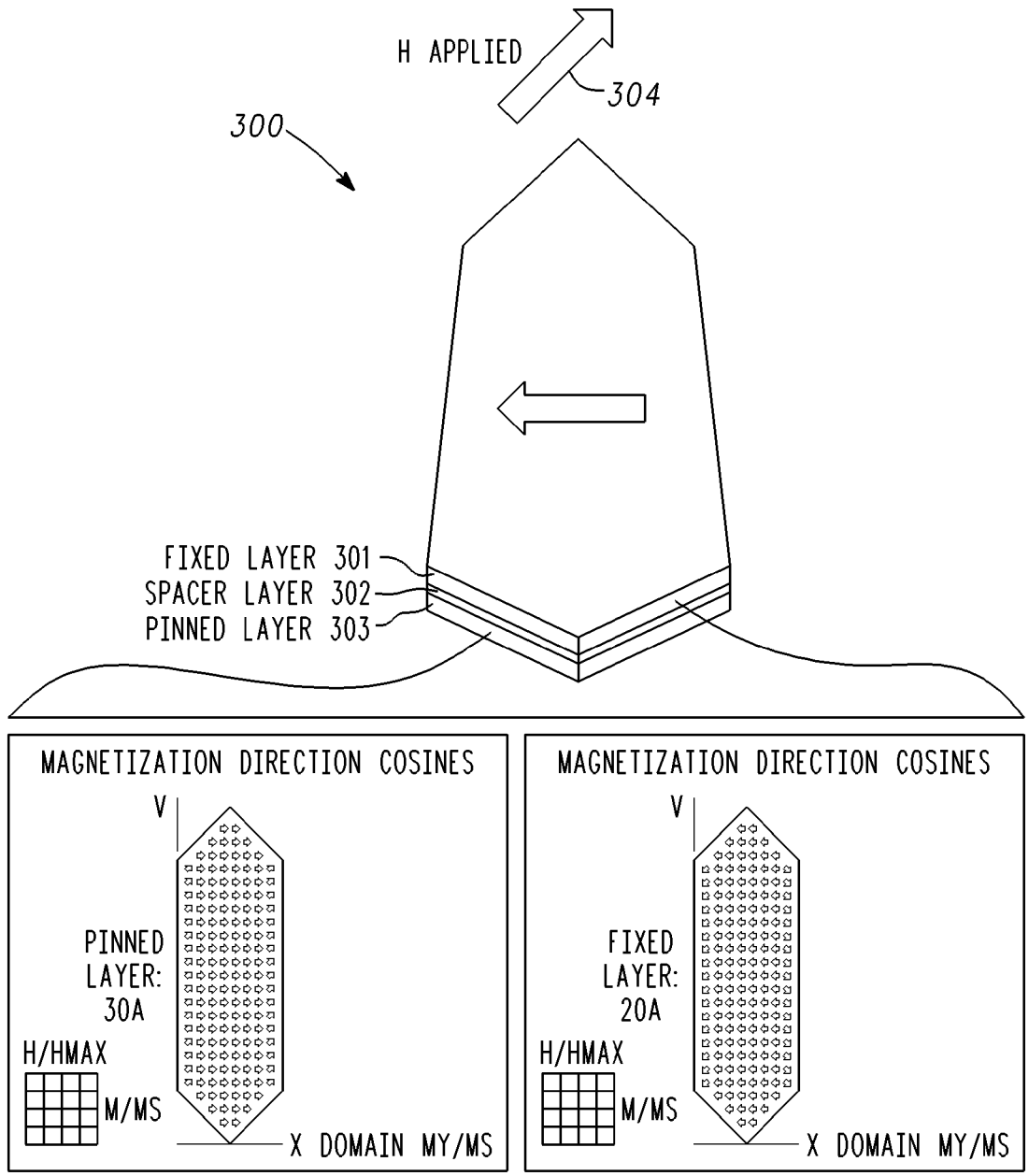
FIG. 3 depicts an imbalanced SAF stack used to form a pinned reference layer.

The pinned reference layer (e.g., 204, 214, 224, 234) may be formed with a single patterned ferromagnetic layer having a magnetization direction (indicated by the arrow) that aligns along the long-axis of the patterned reference layer(s). However, in other embodiments, the pinned reference layer may be implemented with a synthetic anti-ferromagnetic (SAF) layer which is used to align the magnetization of the pinned reference layer along the short axis of the patterned reference layer(s). As will be appreciated, the SAF layer may be implemented in combination with an underlying anti-ferromagnetic pinning layer, though with SAF structures with appropriate geometry and materials that provide sufficiently strong magnetization, the underlying anti-ferromagnetic pinning layer may not be required, thereby providing a simpler fabrication process with cost savings. For example, FIG. 3 depicts a pinned reference layer 300 formed from an imbalanced synthetic anti-ferromagnet (SAF) having two differing ferromagnet layers 301, 303 separated by a Ruthenium spacer layer 302, where the ferromagnetic layers above 301 and below 303 the ruthenium layer 302 have different magnetic moments. Either or both of the ferromagnetic layers may be formed with CFB (Cobalt Fe Boron) or any desired ferromagnetic alloy. For example, CoFe may be used for the lower layer and CFB may be used for the upper layer in an exemplary embodiment. At certain periodic thicknesses of the Ruthenium spacer layer 302, the two ferromagnet layers 301, 303 will be exchange coupled so that the anti-parallel state is the low energy state. As a result, the net magnetic moment is minimized and the immunity to external field response is strengthened. An exemplary implementation and micromagnetic simulation of an imbalanced SAF stack 300 is shown in FIG. 3, where the imbalanced SAF 300 includes a fixed layer 301 formed with CFB to a thickness of approximately 20 Angstroms, a spacer layer 302 formed with Ruthenium to a thickness of approximately 10 Angstroms, and a pinned layer 303 formed with CFB to a thickness of approximately 30 Angstroms. With this exemplary SAF structure, a net moment is created which will respond to the externally applied magnetic field H 304 as shown in FIG. 3. For a reference layer formed with a SAF that has micron scale dimensions (e.g., greater than approximately 2 um along the short axis), the magnetization tends to align anti-parallel along the short axis instead of along the long axis, hence the short axis sets the pinning direction. This results from the fact that the lowest energy state is for the two layers to close their magnetic flux along the short axis of the patterned shape. In remanence (e.g., after the setting field is removed), the magnetic moment of the largest moment layer (e.g., the lower pinned layer 303 in this example) aligns so that it is along the short axis of the SAF in the direction that has a positive projection onto the setting field angle (to the right in this example). Conversely, the magnetic moment of the smaller moment layer (e.g., the upper fixed or reference layer 301 in this example) aligns in the opposite direction from the pinned layer 303, as shown in FIG. 3.

Referring again to FIG. 2, the upper or sense layers 202, 212, 222, 232, may be formed with one or more layers of ferromagnetic materials to a thickness in the range 10 to 5000 Å, and in selected embodiments in the range 10 to 60 Å. The upper ferromagnetic materials may be magnetically soft materials, such as NiFe, CoFe, Fe, CFB and the like. In each MTJ sensor, the upper ferromagnetic layers 202, 212, 222, 232 function as a sense layer or free magnetic layer because the direction of their magnetization can be deflected by the presence of an external applied field, such as the Earth's magnetic field. As finally formed, the upper or sense layers 202, 212, 222, 232 may be formed with a single ferromagnetic layer having a magnetization direction (indicated with the arrows) that aligns along the long-axis of the patterned shapes 202, 212, 222, 232.

The pinned and sense electrodes may be formed to have different magnetic properties. For example, the pinned electrodes 204, 214, 224, 234 may be formed with an anti-ferromagnetic film exchange layer coupled to a ferromagnetic film to form layers with a high coercive force and offset hysteresis curves so that their magnetization direction will be pinned in one direction, and hence substantially unaffected by an externally applied magnetic field. In contrast, the sense electrodes 202, 212, 222, 232 may be formed with a magnetically soft material to provide different magnetization directions having a comparatively low anisotropy and coercive force so that the magnetization direction of the sense electrode may be altered by an externally applied magnetic field. In selected embodiments, the strength of the pinning field is about two orders of magnitude larger than the anisotropy field of the sense electrodes, although different ratios may be used by adjusting the respective magnetic properties of the electrodes using well known techniques to vary their composition.

As shown in FIG. 2, the pinned electrodes 204, 214, 224, 234 in the MTJ sensors are formed to have a first exemplary magnetization direction in the plane of the pinned electrode layers 204, 214, 224, 234 (identified by the vector arrows pointing toward the top of the drawing of FIG. 2). As described herein, the magnetization direction for the pinned electrodes 204, 214, 224, 234 may be obtained using shape anisotropy of the pinned electrodes, in which case the shapes of the pinned electrodes 204, 214, 224, 234 may each be longer in the direction of the "up" vector arrow. In particular, the magnetization direction for the pinned electrodes 204, 214, 224, 234 may be obtained by first heating the shaped reference layers 204, 214, 224, 234 in the presence of a orienting magnetic field which is oriented non-orthogonally to the axis of longest orientation for the shaped pinned electrodes 204, 214, 224, 234 such that the applied orienting field includes a field component in the direction of the desired pinning direction for the reference layers 204, 214, 224, 234. The magnetization directions of the reference layers are aligned, at least temporarily, in a predetermined direction. However, by appropriately heating the reference layers during this treatment and removing the orienting field without reducing the heat, the magnetization of the reference layers relaxes along the desired axis of orientation for the shaped pinned electrodes 204, 214, 224, 234. Once the magnetization relaxes, the reference layers can be annealed and/or cooled so that the magnetic field direction of the pinned electrode layers is set in the desired direction for the shaped pinned electrodes 204, 214, 224, 234. In accordance with the exemplary embodiments of the present invention, a true orthogonal setting may be accomplished by at least one of: 1) tailoring the intrinsic anisotropy of the reference layer material by applying differing field directions to introduce differing intrinsic anisotropy directions during the film deposition and the setting procedure, 2) applying a small field during the pinning portion of the magnetic anneal for proper compensation, and 3) forming the reference layers with a non-orthogonal axis wherein the final induced magnetizations are truly orthogonal. With this approach, the formation of the magnetization direction for the pinned electrodes 204, 214, 224, 234 can readily be reconciled with the fabrication steps used to form other pinning electrodes having distinct magnetization direction(s).

Figure 4:
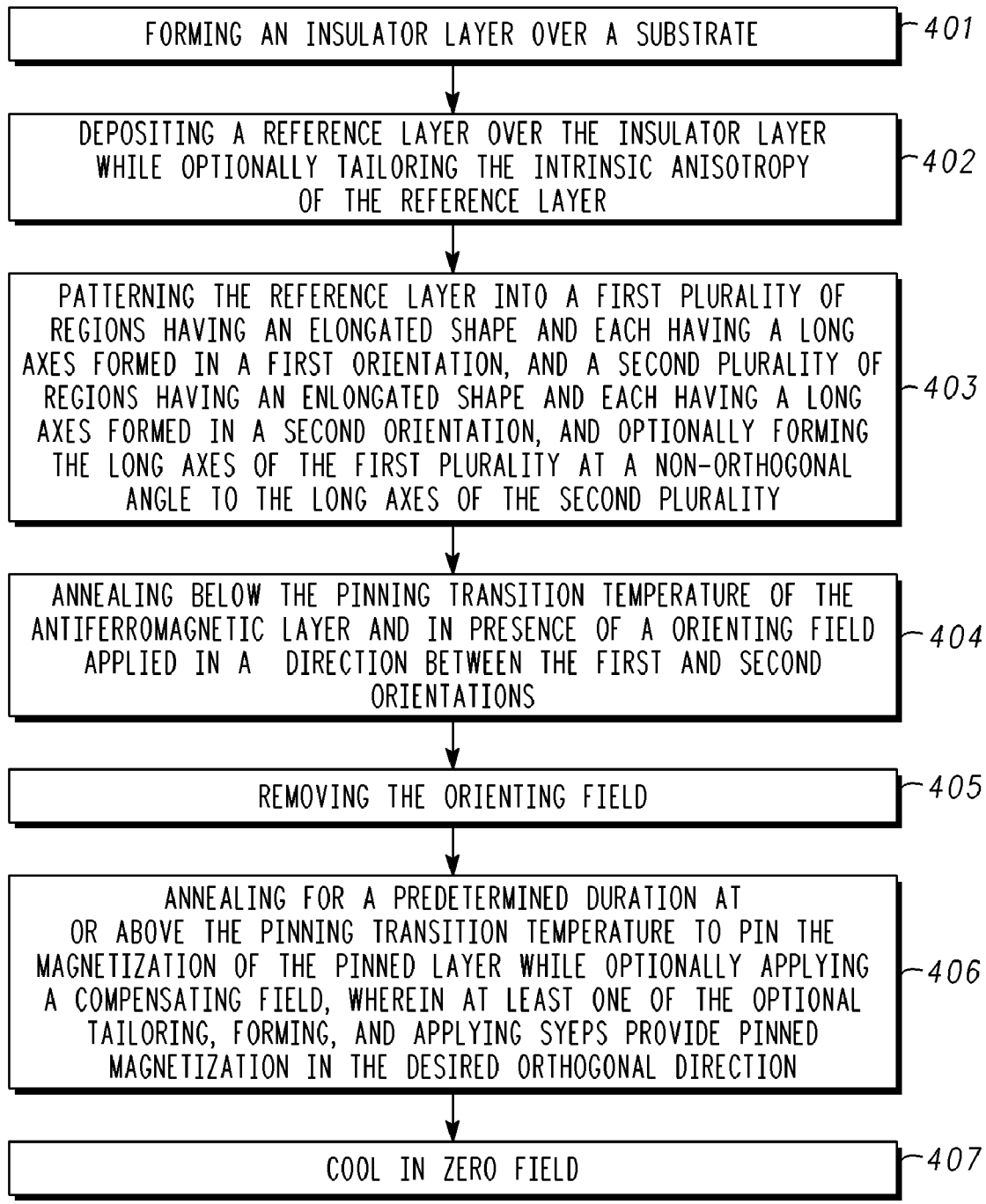
FIG. 4 is a flowchart of a method of fabricating MTJ field sensors in accordance with a first exemplary embodiment.

A first exemplary embodiment is illustrated with reference to FIG. 4, which depicts a flowchart showing an exemplary method of fabricating MTJ field sensors which have orthogonal reference layers using a bulk wafer setting procedure to form shaped reference electrodes from a single reference layer. At steps 401 a substrate structure is provided using known semiconductor processing techniques. As will be appreciated, the substrate structure includes a substrate that is covered by a base insulator layer, where one or more active circuit elements, such as smart power or analog integrated circuits, are formed on or in the substrate. The substrate and active circuit(s) may be formed as part of a front-end semiconductor fabrication process.

Next at step 402, the MTJ core structures are formed by depositing the sensor layers 201, 211, 221, 231 over the base insulator layer using a multi-step fabrication process. At this point, the sensor layers may be formed as part of a back-end magnetics fabrication process which occurs after the front-end semiconductor fabrication process. At step 402, the first of the sensor layers is formed by depositing at least a first anti-ferromagnetic electrode layer (e.g., iridium manganese (IrMn), etc.), and a ferromagnetic layer or synthetic antiferromagnetic (reference layer 204, 214, 224, 234 formed of for example, cobalt iron, cobalt iron boron, ruthenium, nickel, nickel iron and the like, or any combination thereof) over the substrate structure. Though not shown, the first ferromagnetic electrode layer(s) may be deposited in electrical contact with an underlying conductive contact layer. The materials chosen to form the pinning layer and the first ferromagnetic electrode layer should be such that the resultant ferromagnetic layer will have a relatively high pinning strength, and should be sufficiently refractory so as to withstand annealing temperatures (e.g., 200 to 350 degrees Celsius) if used to pin the magnetization direction of the first ferromagnetic electrode layer in a predetermined orientation. Additional sensor layers, such as the tunneling dielectric layer(s) 203, 213, 223, 233 and the sense electrode layer(s) 202, 212, 222, 232, may also be deposited at this time using well known techniques. The intrinsic anisotropy (atomic-level pair ordering) of the reference layer 204, 214, 224, 234, in accordance with the first embodiment, may be tailored during deposition in order to obtain a true orthogonal directional difference between the pinned magnetizations. For low small level of compensation required here, the direction of the pair-ordering anisotropy is set by an applied magnetic field during deposition. Methods of inducing a stronger anisotropy than by shape and intrinsic include growing a magnetic material with a preferred crystalline orientation and inducing by certain anisotropic film growth methods (for example, from shape asymmetry of the growing clusters or crystallites).

Figure 5:
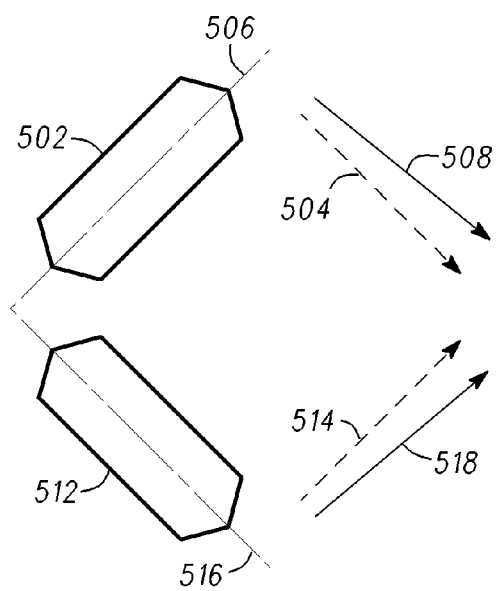
FIG. 5 is a top schematic view of two reference layers formed from imbalanced synthetic anti-ferromagnets (SAFs) and their actual and desired magnetizations.
Figure 6:
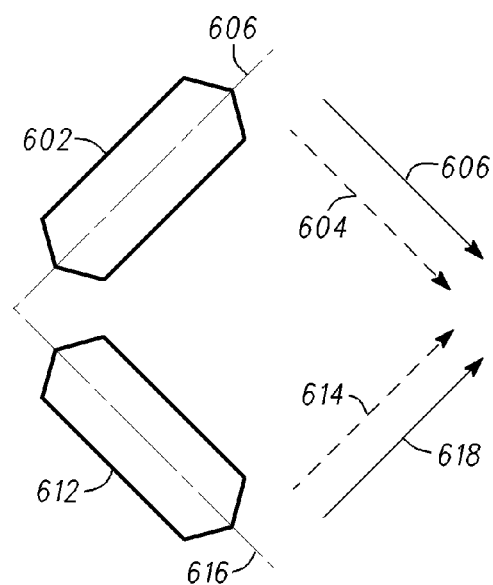
FIG. 6 is a top schematic view of the two reference layers of FIG. 5 but rotated in accordance with an exemplary embodiment.

At step 403, the deposited first ferromagnetic electrode layer(s) are also patterned and selectively etched into elongated shapes having long axes drawn with different orientations. As a result of the etching, each shaped reference layer has a preferred shape anisotropy direction in the direction of the desired pinned magnetization direction. However, due to intrinsic anisotropy, the actual pinning may be different from that desired. For example, FIG. 5 shows a first reference layer 502 having a desired pinning (direction 504) orthogonal to the long axis 506. However, an actual pinning (direction 508) is different from the desired pinning (direction 504). A second reference layer 512 has a desired pinning (direction 514) orthogonal to the long axis 516. However, an actual pinning (direction 518) is different from the desired pinning (direction 514). In order to obtain a true orthogonal angle of the actual pinned magnetizations, a determination may be made from empirical pre-obtained results of the pinned magnetizations in relation to the long axes allowing for a positioning of the patterned elongated shapes in a direction to one another to provide the true orthogonal angle. The patterning (step 33) of the reference layers 602, 612 shown in FIG. 6 may be adjusted by modifying the angle between the long axes 606, 616 that results in the actual pinning (directions 608, 618) being orthogonal as desired (directions 604, 614).

At step 404, the etched reference layers, for materials such as PtMn which undergo a phase transition as the temperature crosses its transformation temperature, are heated or annealed below the pinning transition temperature in the presence of a orienting field that is applied with a direction that is between the different desired pinned magnetization directions for the different reference layers. For example, if two orthogonally oriented pinned layers are being formed, the applied orienting field may be oriented half-way between the desired orientations of the orthogonal pinned layers. Stated more generally, the applied orienting field should be oriented so that it includes a field component in the direction of each of the desired pinning directions for the reference layers. The properties of the materials used to form the reference layer will control how heat is to be applied. The heat step should be controlled so that the magnetizations of the shaped reference layers are free to follow the external magnetic field.

Figure 7:
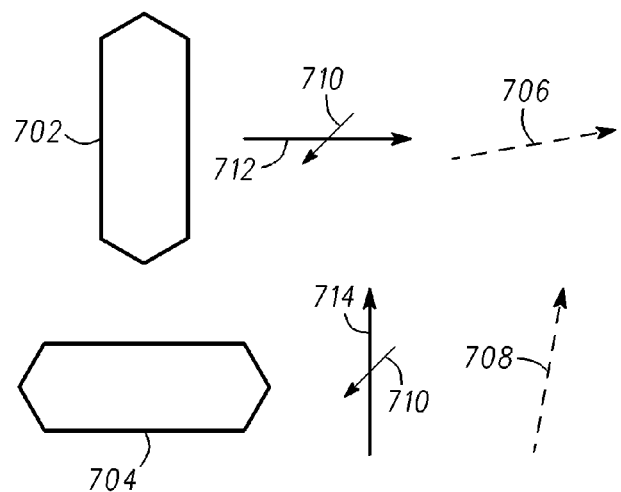
FIG. 7 is a top schematic view of two reference layers formed from imbalanced SAFs and their actual magnetizations with a compensating field applied in accordance with an exemplary embodiment.

At step 405, the orienting magnetic field is removed, and at step 406, an anneal temperature at or above the pinning transition temperature is maintained for a predetermined duration (e.g., two hours). In the absence of an applied field, the high aspect ratio patterns provide a shape anisotropy that forces the applied magnetization in the shaped reference layers to relax along the respective anisotropy axes of the shaped reference layers. The direction of this applied magnetization may be fine tuned (so as to provide truly orthogonal magnetization directions) by applying a compensating field. FIG. 7 illustrates first and second reference layers 702, 704, each having a relaxation preference (directions) 706, 708 respectively. The application of a compensating field 710 overcomes the influence provided by the combination of intrinsic anisotropy and magnet residual field resulting in the actual pinning 712, 714 directed in the desired directions and orthogonal to one another.

At step 407, the wafer is then cooled in zero (or compensating) field so that the shape-induced magnetizations in the reference layers are pinned, thereby providing multiple orientations of reference layer. By cooling the reference layers below the pinning temperature after the shape-induced magnetizations are obtained in the zero or small compensating field, the magnetizations of the reference layers become pinned, and will remain rigidly pinned in their respective directions, at least for typical applied field strengths.

In summary, the pinned magnetizations in desired orthogonal directions may be fine tuned by applying one or more of tailoring the intrinsic anisotropy during deposition, positioning the long axes with respect to one another during patterning, and applying a compensating field during the pinning anneal.

Figure 8:
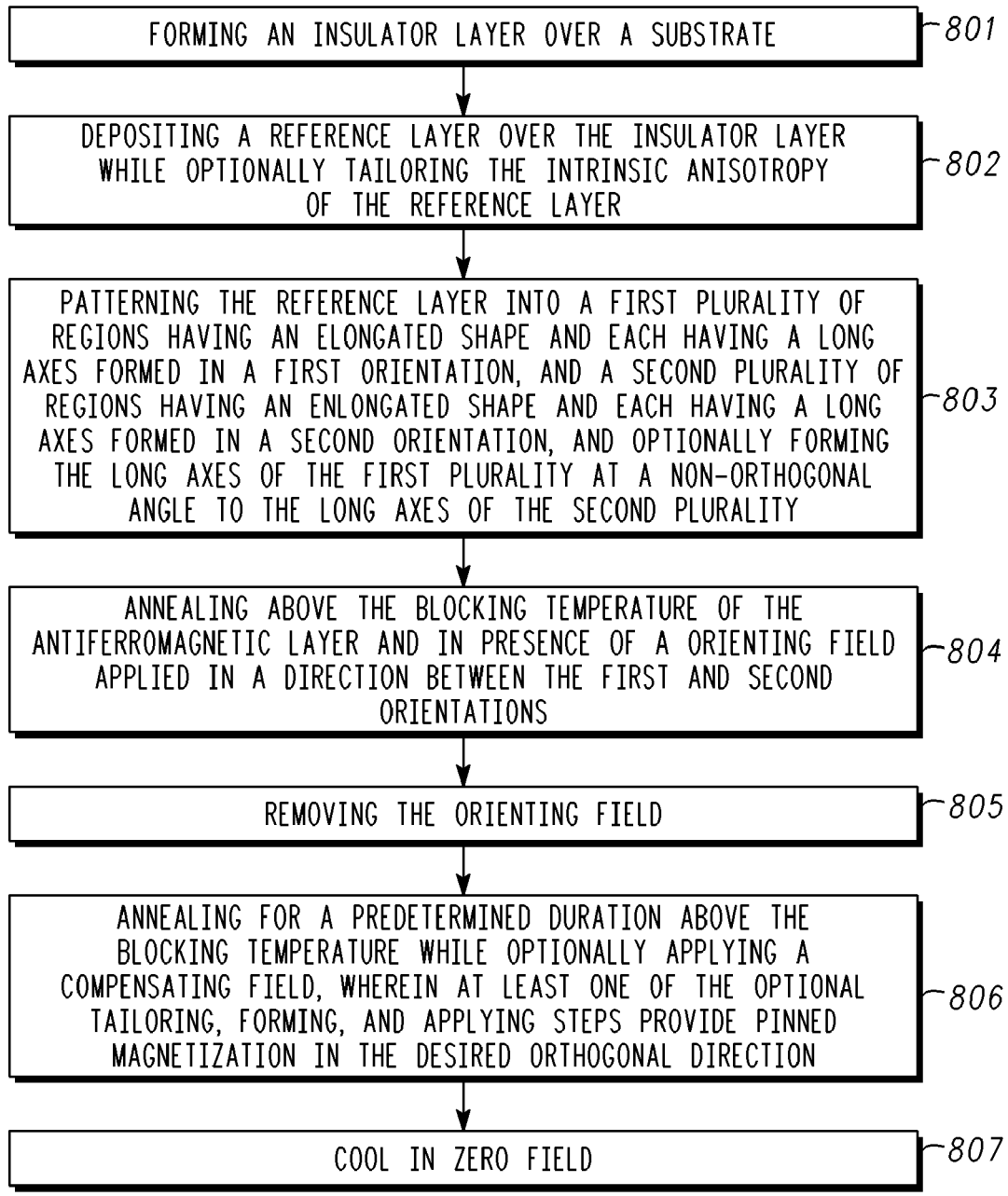
FIG. 8 is a flowchart of a method of fabricating MTJ field sensors in accordance with a second exemplary embodiment.

A second exemplary embodiment is illustrated in FIG. 8. Steps 801, 802, 803, 805, 806, and 807 are similar to steps 401, 402, 403, 405, 406, and 407 of FIG. 4. However, step 804 describes annealing above a blocking temperature of the antiferromagnetic layer in the presence of an orienting field applied in a direction between the first and second orientations. This process applies for materials having no phase transition, such as IrMn, but having a blocking temperature that governs the onset of pinning. The annealing step 806 may be accomplished above the blocking temperature.

Using the techniques disclosed herein, first and second differential sensors (e.g., sensors 101, 111 shown in FIG. 1) may be fabricated together on a monolithic integrated circuit by forming the first reference layers 106-109 with a first pinning direction and simultaneously forming the second reference layers 116-119 with a second pinning direction that is orthogonal to the first pinning direction. These techniques may be further illustrated with a description of an exemplary process flow, beginning with FIG. 9 which depicts a partial cross-sectional view of a multi-sensor structure in which a stack of MTJ sensor layers 960, 970, 980 have been formed over a substrate 940 and base insulator layer 950. When the sensors are to be integrated with semiconductor circuitry, conductive vias through the insulator layer 950, made by methods known by those skilled in the art, will connect conductive portions of the sensors to the underlying circuitry in the substrate 940. Depending on the type of transistor device being fabricated, the substrate 940 may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate 940 may be implemented as the top semiconductor layer of a semiconductor-on-insulator (SOI) structure. Though not shown, one or more circuit elements may be formed on or in the substrate 940. In addition, a base insulator layer 950 is formed by depositing or growing a dielectric (e.g., silicon dioxide, oxynitride, metal-oxide, nitride, etc.) over the semiconductor substrate 940 using chemical vapor deposition (CVD), plasma-enhanced chemical vapor deposition (PECVD), physical vapor deposition (PVD), atomic layer deposition (ALD), ion beam deposition (IBD), thermal oxidation, or combinations of the above.

Over the base insulator layer 950, the stack of sensor layers is sequentially formed by depositing a first conductive layer (not shown) to serve after etching as a conductive line, one or more lower ferromagnetic layers 960 (to serve after etching as the lower reference ferromagnetic layer), one or more dielectric layers 970 (to serve after etching as the tunnel barrier layer), one or more upper ferromagnetic layers 980 (to serve after etching as the upper sense ferromagnetic layer), and a second conductive layer (not shown) to serve after etching as the conductive line. Each of the layers may be blanket deposited using known techniques, such as CVD, PECVD, PVD, ALD, IBD, or combinations thereof to a predetermined thickness. In this way, the stack of sensor layers covers the entire wafer so that the stack is formed in the "Sensor 1" area where a first type of sensor (e.g., x-axis sensors) will be formed, and is also formed in the "Sensor 2" area where a second type of sensor (e.g., y-axis sensors) will be formed. In addition, the sensor stack may be formed in "Other" areas where a sensor having any desired orientation will be formed.

Figure 9:
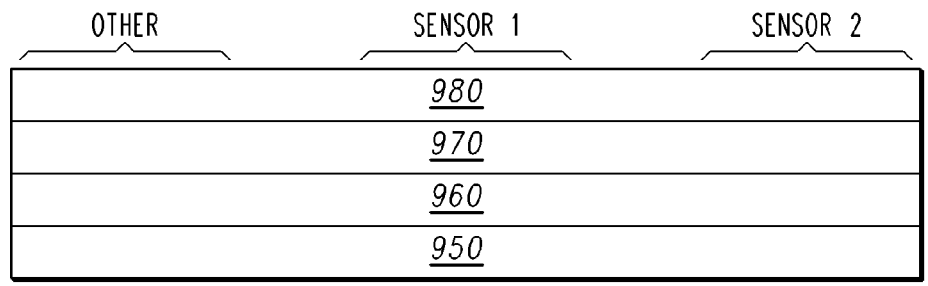
FIG. 9 is a partial cross-sectional view of an integrated circuit in which a stack of MTJ sensor layers have been formed over a substrate.
Figure 10:
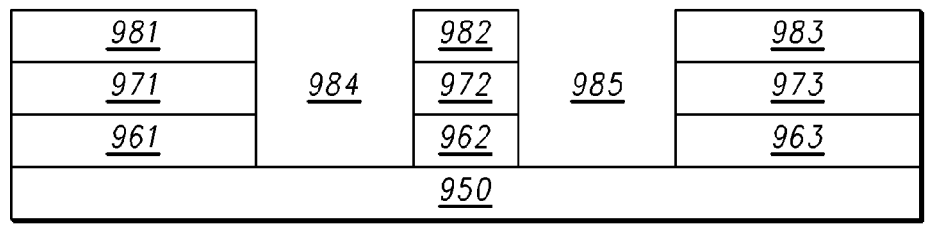
FIG. 10 illustrates processing subsequent to FIG. 9 after the stack of MTJ sensor layers have been selectively etched into predetermined shapes over the substrate.
Figure 11:
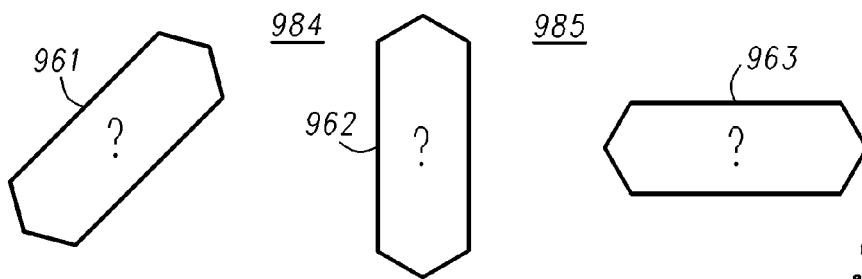
FIG. 11 illustrates a top view to show the predetermined shapes of the reference layers in the stack of MTJ sensor layers formed by the selective etch process.

FIG. 10 illustrates processing of the sensor device structures subsequent to FIG. 9 after the stack of MTJ sensor layers 960, 970, 980 have been selectively etched, thereby defining predetermined shapes for the remnant sensor layers over the substrate 940 in each of the sensor areas. Any desired pattern and etching processes may be used to form the patterned sensor layers, including depositing a hardmask layer, such as silicon nitride (not shown), over the upper ferrogmagnetic layer(s) 980, depositing and patterning a photoresist layer (not shown) to pattern the hardmask layer, and then selectively etching (e.g., with a reactive ion etching process) the exposed sensor layers using a photoresist layer (not shown) to form the openings 984, 985. To more clearly see how the selective etch process creates different predetermined shapes from the stack of MTJ sensor layers, reference is made to FIG. 11, which provides a simplified top view of the sensor device structures depicted in FIG. 10. As depicted in FIGS. 10 and 11, the openings 984, 985 in the sensor layer stack 960, 970, 980 define the sensor layers 962, 972, 982 in the first sensor area to have a first shape that is oriented to have an easy axis in the desired pinning direction for the finally formed reference layer 962. In similar fashion, the openings 984, 985 define the shape of the sensor layers 963, 973, 983 in the second sensor area so that they have an easy axis in the desired pinning direction for the finally formed reference layer 963. While the openings 984, 985 can be used to define orthogonally oriented shapes 962, 963, any desired orientation can be achieved by properly patterning and controlling the etch process. For example, sensor layers 961, 971, 981 in the "other" sensor area may be defined to have another shape that is oriented to have an easy axis in the desired pinning direction for the finally formed reference layer 961. In addition to being formed as long and narrow shapes, additional shaping may be provided so that each of the pinned reference layers performs more like a single magnetic domain. In FIG. 11, the additional shaping is shown in the reference layers 961, 962, 963, which are shaped to have pointed ends that taper.

Figure 12:
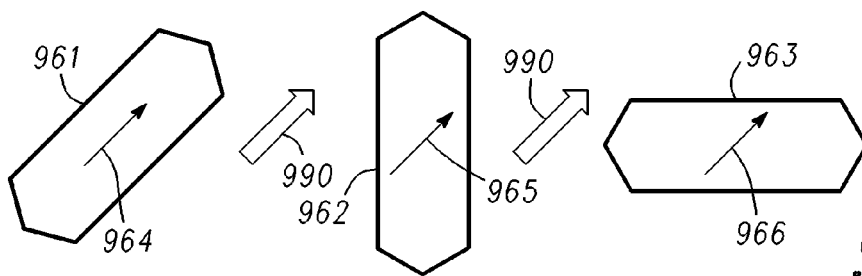
FIG. 12 illustrates processing subsequent to FIG. 11 when the etched reference layers are heated in the presence of an orienting field that is aligned between the desired magnetization directions for the finally formed reference layers.

Once the shaped reference layers 961, 962, 963 are formed, the desired pinning direction for the reference layers may be induced by first heating or annealing the wafer in the presence of a orienting field that is oriented between the orientations of the reference layers 961, 962, 963, and then removing the field while maintaining a high temperature. The result of heating and orienting the reference layers is shown in FIG. 12, which illustrates processing of the sensor device structures subsequent to FIG. 11 when the etched reference layers 961, 962, 963 are heated in the presence of orienting field. As shown in FIG. 12, the orienting field is aligned in a direction 990 that is between the desired magnetization directions for the finally-formed reference layers. However, at this stage in the process, the magnetizations of the reference layers 961, 962, 963 (as shown with the magnetization vectors 964, 965, 966, respectively), when heated sufficiently, follow the external magnetic field 990.

Figure 13:
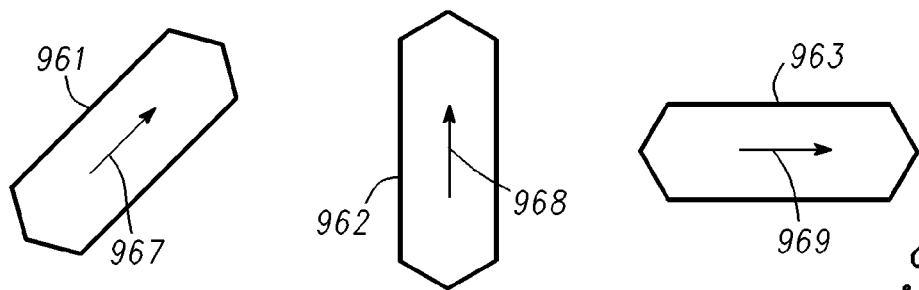
FIG. 13 illustrates processing subsequent to FIG. 12 after the orienting field is removed and the etched stack of MTJ sensors are cooled, thereby causing the magnetization of the etched reference layer to be pinned along the long axis.

FIG. 13 illustrates the magnetization orientations of the reference layers in the sensor device structures subsequent to FIG. 12 after the orienting field 990 is removed and the etched stack of MTJ sensor layers are cooled. By cooling the wafer in a zero or small compensating field, the respective shapes of the reference layers 961, 962, 963 provide shape anisotropy that causes the magnetization of each reference layer to relax along a desired direction. Thus, the magnetization 968 of first reference layer 962 follows its shape so that it is aligned with the desired dimension of the shaped reference layer 962 (e.g., in the y-axis direction), thereby forming the desired pinning direction for the finally-formed reference layer 962. In similar fashion, the desired pinning direction for the finally-formed reference layer 963 is induced when the magnetization 969 of second reference layer 963 follows its shape anisotropy (e.g., in the x-axis direction). Of course, any desired pinning direction can be induced by properly shaping the reference layer, as shown with the reference layer 961 where the magnetization 967 follows the shape anisotropy of reference layer 961 (e.g., at 45 degrees from the y-axis).

Figure 14:
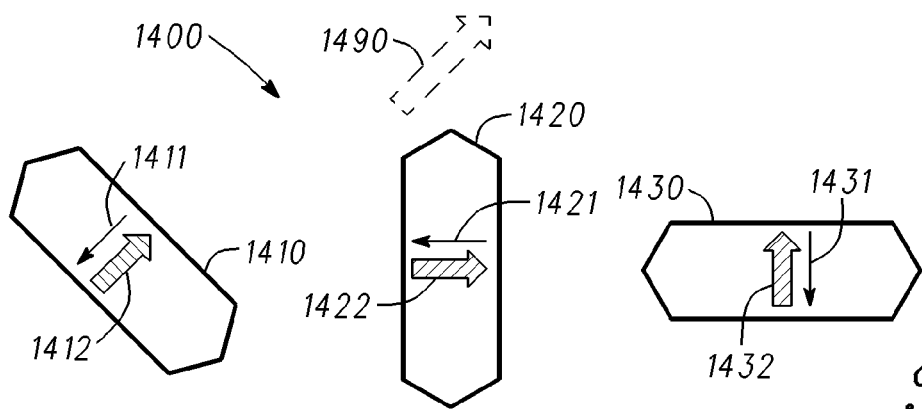
FIG. 14 illustrates processing of the pinned and reference layers formed with imbalanced SAF stacks after the orienting field is removed and the etched stack of MTJ sensors are cooled, thereby causing the magnetization of the etched reference layers to be pinned along the short axis.

FIG. 14 illustrates processing of pinned and reference layers 1400 that are formed by etching imbalanced SAF stacks 1410, 1420, 1430, annealing the layers 1400 in the presence of a orienting field that is oriented between the short-axis orientations of the reference layers, and then removing the orienting field 1490 (as indicated with the dashed line field arrow) and cooling the etched stack of MTJ sensors, thereby causing the magnetization of the etched reference layers 1410, 1420, 1430 to be pinned along their respective short axes. As illustrated, the magnetization orientations of the etched reference layers 1410, 1420, 1430 are pinned along the short axis of the etched reference layers. Thus, in the imbalanced SAF stack 1410, the reference layer magnetization 1411 and pinned layer magnetization 1412 are substantially anti-parallel to each other and orthogonal to the long axis of the etched reference layer 1410. Similarly, the reference layer magnetization 1421 and pinned layer magnetization 1422 in the imbalanced SAF stack 1420 are substantially anti-parallel to each other and orthogonal to the long axis of the etched reference layer 1420, and likewise for the etched reference layer 1430. With the imbalanced SAF stack embodiment depicted in FIG. 14, the long axis of reference layer 1410 is patterned orthogonal to the direction used for a single reference layer 961 shown in FIG. 13 in order to provide a final reference direction that is midway between the orthogonal directions of reference layers 1420 and 1430.

Figure 15:
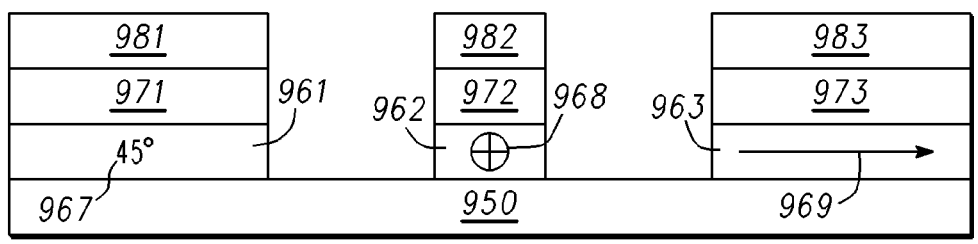
FIG. 15 is a partial cross-sectional view of the stack of MTJ sensor layers showing the pinned magnetization directions in the finally-formed reference layers.

To further illustrate the resulting formation of multiple orientations in different, finally-formed reference layers, reference is now made to FIG. 15 which provides a cross-sectional view of the etched stack of MTJ sensor layers depicted in FIG. 13. As depicted in FIGS. 13 and 15, the etched sensor layer stack 962, 972, 982 in the first sensor area has a reference layer that is pinned in a first pinning direction (e.g., "into" the plane of the drawing in FIG. 15), the etched sensor layer stack 963, 973, 983 in the second sensor area has a reference layer that is pinned in a second pinning direction (e.g., to the "right" in the plane of the drawing in FIG. 15), and the etched sensor layer stack 961, 971, 981 in the other sensor area has a reference layer that is pinned in yet another pinning direction (e.g., at 45 degrees from the plane of the drawing in FIG. 15).

At this point in the fabrication process, each of the upper ferromagnetic or layer(s) 981, 982, 983 (and the tunnel barrier layer(s)) will have been selectively etched into the same shape as the underlying reference layer. However, where the final shape of the sense layers will be smaller than the underlying pinned layers, a second etch sequence may be used to define the final shapes of the different sense layers from the remnant portions of the upper ferromagnetic layer(s) 981, 982, 983. The second etch sequence defines high aspect ratio shapes for the sense layers by using a patterned mask and etch process (e.g., reactive ion etching) to remove all unmasked layers down to and including the unmasked upper ferromagnetic layer(s), but leaving intact the underlying shaped pinning layers. The defined high aspect ratio shapes for the sense layers are oriented so that each sense layer has a shape anisotropy axis. In other words, the long axis for each sense layer is drawn to create the desired easy axis magnetization direction.

It will be appreciated that additional processing steps will be used to fabricate MTJ sensor structures. As examples, one or more dielectric, ferromagnetic and/or conductive layers may be deposited, patterned and etched using well known techniques, along with conventional backend processing (not depicted), typically including formation of multiple levels of interconnect that are used to connect the sensor structures in a desired manner to achieve the desired functionality. Thus, the specific sequence of steps used to complete the fabrication of the sensor structures may vary, depending on the process and/or design requirements.

The disclosed fabrication process may be used to form a magnetic field sensor from two differential sensor configurations which require only two distinct pinning axes which are formed with a single material and annealing step, where each differential sensor is formed from a bridge structures. The distinct pinning axes may be obtained using shape anisotropy of differently shaped pinning layers in combination with a carefully selected process for heating the reference layers in the presence of a properly aligned orienting field.

By now it should be appreciated that there has been provided a ferromagnetic thin-film based magnetic field sensor with two or more reference layer directions and method for fabricating same. As disclosed, a semiconductor substrate and first insulating layer are provided, and a sensor layer stack is formed over the first insulating layer, where the sensor layer stack includes an optional pinning layer formed with an antiferromagnetic material (e.g., IrMn or PtMn), a reference layer formed over the pinning layer and first insulating layer, a nonmagnetic intermediate layer formed on the reference layer, and a second ferromagnetic layer formed on the nonmagnetic intermediate layer. In order to ensure the pinned magnetization is orthogonal, the intrinsic anisotropy optionally may be tailored in a pre-determined manner. The sensor layer stack is selectively etched to form first and second etched electrode stacks, where the first electrode stack has a first shape anisotropy to set a first reference direction, and where the second electrode stack has a second shape anisotropy to set a second reference direction. In order to ensure the pinned magnetization is orthogonal, the long axis may be formed at a non-orthogonal angle. After etching the electrode stacks, an orienting field is applied to be substantially parallel to the substrate and oriented between the first and second reference directions until each reference layer of the first and second electrode stacks has a magnetization that is aligned in a predetermined direction. By removing the orienting field, the first shape anisotropy sets the magnetization of the reference layer of the first electrode stack, and the second shape anisotropy sets the magnetization of the reference layer of the second electrode stack. For example, the magnetization direction of each of the reference layers in the first and second electrode stacks may be set along a longer (or shorter) axis dimension of the first and second electrode stacks, respectively. Where the first reference direction (and first shape anisotropy) is orthogonal to the second reference direction (and second shape anisotropy), the orienting field may be applied substantially parallel to the substrate at an angle that is offset 45 degrees from both the first reference direction and the second reference direction. In other embodiments where the first reference direction (and first shape anisotropy) is less than 180 degrees from the second reference direction (and second shape anisotropy), the orienting field may be applied substantially parallel to the substrate at an angle that is offset equally from both the first reference direction and the second reference direction. Stated more generally, the orienting field may be applied substantially parallel to the substrate at an angle that has a field component along each of the two or more reference layer directions. The application of the orienting field may be accompanied by a heating process whereby the first and second electrode stacks are heated at an elevated temperature. In order to ensure the pinned magnetization is orthogonal, a compensating field is optionally applied during this anneal. A cooling process after removing the orienting field to set the magnetization of the reference layer in the first electrode stack along a first shape-defined axis, and to set the magnetization of the reference layer in the second electrode stack along a second shape-defined axis. For example, the heat step may be implemented, in selected embodiments, by heating the first and second electrode stacks in a orienting field at an elevated temperature above a blocking temperature of first and second antiferromagnetic pinning layers formed in the first and second electrode stacks, respectively, in which case the removal of the orienting field allows the first shape anisotropy to set the magnetization of a pinned layer in the first electrode stack, and allows the second shape anisotropy to set the magnetization of a pinned layer in the second electrode stack. In addition or in the alternative, the first and second electrode stacks may be heated after removing the orienting field at or above an antiferromagnetic crystalline phase formation temperature of first and second antiferromagnetic layers formed in the first and second electrode stacks, respectively. By subsequently cooling the first and second electrode stacks, the magnetization of a pinned layer in the first electrode stack is pinned along a first shape-defined axis, and the magnetization of a pinned layer in the second electrode stack is pinned along a second, different shape-defined axis.

In another form, there is provided a ferromagnetic thin-film based magnetic field sensor with two or more reference directions and method for fabricating same. As disclosed, a reference layer structure is formed over and insulated from a substrate, where the reference layer structure includes an imbalanced synthetic anti-ferromagnet formed with first and second ferromagnet layers separated by a spacer layer and having different magnetic moments. In order to ensure the pinned magnetization is orthogonal, the intrinsic anisotropy optionally may be tailored in a pre-determined manner. There may also be a pinning layer formed below the imbalanced SAF with an anti-ferromagnetic material (e.g., IrMn or PtMn). The reference layer structure is selectively etched to form first and second etched electrode stacks, where the first electrode stack has a first shape anisotropy to set a first reference direction, and where the second electrode stack has a second shape anisotropy to set a second reference direction. In order to ensure the pinned magnetization is orthogonal, the long axis may be formed at a non-orthogonal angle. After etching the electrode stacks, an orienting field is applied to be substantially parallel to the substrate and oriented between the first and second reference directions until each of the first and second electrode stacks (e.g., the SAF in each stack) has a magnetization that is aligned in a predetermined direction. By removing the orienting field, the first shape anisotropy sets the magnetization of the first and second ferromagnetic layers of the first electrode stack, and the second shape anisotropy sets the magnetization of the first and second ferromagnetic layers of the second electrode stack. For example, the magnetization direction of each of the first and second ferromagnetic layers in the first and second electrode stacks may be set along a longer (or shorter) axis dimension of the first and electrode stacks, respectively. To this end, the first electrode stack has a first shape anisotropy in which a first longer (or shorter) axis dimension is aligned with the first reference direction, and the second electrode stack has a second shape anisotropy in which a second longer (or shorter) axis dimension is aligned with the second reference direction. Stated more generally, the orienting field may be applied substantially parallel to the substrate at an angle that has a field component along each of the two or more reference directions. The application of the orienting field maybe accompanied by a heating process whereby the first and second electrode stacks are heated at an elevated temperature, and a cooling process after removing the orienting field to set the magnetization of the imbalanced synthetic anti-ferromagnet in the first electrode stack along a first shape-defined axis, and to set the magnetization of the imbalanced synthetic antiferromagnet in the second electrode stack along a second, different shape-defined axis. For example, the heat step may be implemented, in selected embodiments, by heating the first and second electrode stacks in a orienting field at an elevated temperature above a blocking temperature of first and second antiferromagnetic pinning layers formed in the first and second electrode stacks, respectively, in which case the removal of the orienting field allows the first shape anisotropy to set the magnetization of a pinned layer in the first electrode stack, and allows the second shape anisotropy to set the magnetization of a pinned layer in the second electrode stack. In addition or in the alternative, the first and second electrode stacks may be heated after removing the orienting field at or above an antiferromagnetic crystalline phase formation temperature of first and second antiferromagnetic layers formed in the first and second electrode stacks, respectively. In order to ensure the pinned magnetization is orthogonal, a compensating field is optionally applied during this anneal. By subsequently cooling the first and second electrode stacks, the magnetization of a pinned layer in the first electrode stack is pinned along a first shape-defined axis, and the magnetization of a pinned layer in the second electrode stack is pinned along a second, different shape-defined axis.

In yet another form, there is provided a ferromagnetic thin-film based magnetic field sensor having two or more reference layer magnetization directions, and associated manufacturing method. As disclosed, the sensor includes first and second sensor layer stacks formed over and insulated from a subtracted. The first and second sensor layer stacks each include a reference layer that is formed over the first insulating layer, and may also each include an antiferromagnetic layer adjacent to the respective reference layers. In selected embodiments, each of the first and second reference layers is implemented as an imbalanced synthetic antiferromagnet formed with first and second ferromagnet layers separated by a spacer layer, where the first and second ferromagnetic layers have different magnetic moments. In addition, the first and second ferromagnetic layers may each have a magnetization that is aligned along a short (or long) axis of the first and second reference layers, respectively. As formed, the first electrode stack has a first shape anisotropy defining a first reference direction for the first reference layer, and the second electrode stack has a second shape anisotropy defining a second reference direction for the second reference layer that is different from the first reference direction. In order to ensure the pinned magnetization is orthogonal, at least one of the intrinsic anisotropy is tailored in a pre-determined manner and the long axis is formed at a non-orthogonal angle.

Although the described exemplary embodiments disclosed herein are directed to various sensor structures and methods for making same, the present invention is not necessarily limited to the exemplary embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the relative positions of the sense and pinning layers in a sensor structure may be reversed so that the pinning layer is on top and the sense layer is below. Also the sense layers and the pinning layers may be formed with different materials than those disclosed. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A method for fabricating a ferromagnetic thin-film based magnetic field sensor comprising two or more reference layer pinning directions, comprising:
   providing a substrate;
   forming a first insulating layer over the substrate;
   depositing a sensor layer stack over the first insulating layer, the sensor layer stack comprising a first ferromagnetic layer formed over the first insulating layer, a nonmagnetic intermediate layer formed on the first ferromagnetic layer, and a second ferromagnetic layer formed on the nonmagnetic intermediate layer, and an antiferromagnetic layer disposed one of between the first ferromagnetic layer and the first insulating layer or on the second ferromagnetic layer, wherein the first or second ferromagnetic layer adjacent the antiferromagnetic layer comprises a reference layer;
   selectively etching the sensor layer stack to form a first electrode stack and a second electrode stack, the first electrode stack having a first shape anisotropy axis and the second electrode stack having a second shape anisotropy axis;
   applying an orienting field substantially parallel to the substrate that is oriented between the first and second reference directions to align the magnetization of each reference layer of the first and second electrode in a predetermined direction;
   removing the orienting field to allow the first shape anisotropy to set the magnetization direction of the reference layer of the first electrode stack, and to allow the second shape anisotropy to set the magnetization direction of the reference layer of the second electrode stack;
   after removing the orienting field, heating the first and second electrode stacks at or above the pinning temperature of the antiferromagnetic layer in the first and second electrode stacks, and subsequently cooling the first and second electrode stacks, thereby pinning the magnetization of the reference layer in the first electrode stack along a first shape-defined axis, and pinning the magnetization of the reference layer in the second electrode stack along a second shape-defined axis; and
   providing a first pinned magnetic vector in the first electrode stack in a first desired reference direction and a second pinned magnetic vector in the second electrode stack in a second desired reference direction, by at least one of:
      tailoring the intrinsic anisotropy of the reference layer during the depositing step;
      forming a long axes of the first electrode stack at a non-orthogonal angle to the long axes of the second electrode stack during the etching step; and
      applying a compensating field during the heating step.

2. The method of claim 1, where the first and second pinned reference layer directions are substantially orthogonal.

3. The method of claim 1, where the orienting field is removed above the pinning transition temperature of the antiferromagnetic layer.

4. The method of claim 1, where the magnetization direction of the reference layer in the first electrode stack is set along a longer axis dimension of the first electrode stack, and where the magnetization direction of the reference layer in the second electrode stack is set along a longer axis dimension of the second electrode stack.

5. The method of claim 1, where the magnetization direction of the reference layer in the first electrode stack is set along a shorter axis dimension of the first electrode stack, and where the magnetization direction of the reference layer in the second electrode stack is set along a shorter axis dimension of the second electrode stack.

6. The method of claim 1, where each of the first and second electrode stacks comprises an anti-ferromagnetic layer comprising one of iridium manganese and platinum manganese.

7. The method of claim 1, where the first reference direction is orthogonal to the second reference direction, and where applying the orienting field substantially parallel to the substrate comprises applying the orienting field at an angle that is offset 45 degrees from both the first reference direction and the second reference direction.

8. The method of claim 1, where the first reference direction is less than 180 degrees from the second reference direction, and where applying the orienting field substantially parallel to the substrate comprises applying the orienting field at an angle that is offset equally from both the first reference direction and the second reference direction.

9. The method of claim 1, where the sensor layer stack comprises an imbalanced synthetic antiferromagnetic layer.

10. The method of claim 9, where the orienting field is larger than the saturation field of the synthetic antiferromagnet.

11. The method of claim 1, where applying the orienting field substantially parallel to the substrate comprises applying the orienting field at an angle that has a field component along each of the two or more reference layer directions.

12. The method of claim 11, where the magnetization direction of the first and second ferromagnetic layers of the first electrode stack is set along a longer axis dimension of the first electrode stack, and where the magnetization direction of the first and second ferromagnetic layers of the second electrode stack is set along a longer axis dimension of the second electrode stack.

13. The method of claim 11, where the first electrode stack has a first shape anisotropy in which a first shorter axis dimension is aligned with the first reference direction, and where the second electrode stack has a second shape anisotropy in which a second shorter axis dimension is aligned with the second reference direction.

14. A method for fabricating a ferromagnetic thin-film based magnetic field sensor comprising two or more reference layer setting directions, comprising:
   forming a reference layer structure comprising:
      an intermediate layer;
      a sense ferromagnet layer formed on the intermediate layer; and
      an antiferromagnetic layer;
      an imbalanced synthetic anti-ferromagnet comprising:
         a reference ferromagnet layer formed adjacent the intermediate layer;
         a pinned ferromagnet layer formed adjacent the antiferromagnetic layer; and
         a coupling layer disposed between the pinned and pinned ferromagnet layer; wherein the first and second ferromagnetic layers have different magnetic moments;
   etching the sensor layer stack to form a first electrode stack and a second electrode stack, the first electrode stack having a first shape anisotropy axis and the second electrode stack having a second shape anisotropy axis;

applying an orienting field substantially parallel to the substrate that is oriented between the first and second reference directions to align the magnetization of each reference layer of the first and second electrode in a predetermined direction;

removing the orienting field to allow the first shape anisotropy to set the magnetization direction of the reference ferromagnet layer within the first electrode stack and the second shape anisotropy to set the magnetization direction of the reference ferromagnet layer within the second electrode stack;

after removing the orienting field, heating the first and second electrode stacks at or above the pinning temperature of the antiferromagnetic layer of the first and second electrode stacks, respectively, and subsequently cooling the first and second electrode stacks, thereby pinning the magnetization of a reference ferromagnet layer within the first electrode stack along a first shape-defined axis, and pinning the magnetization of the reference ferromagnet layer within the second electrode stack along a second shape-defined axis; and providing pinned magnetic vectors in the first and second electrode stacks in a first and second desired reference direction, respectively, by at least one of:
   tailoring the intrinsic anisotropy of the reference ferromagnet layer during the depositing step;
   forming a long axes of the first electrode stack at a non-orthogonal angle to the long axes of the second electrode stack during the etching step; and
   applying a compensating field during the heating step.

15. The method of claim 14, where the orienting field is removed above the pinning transition temperature of the antiferromagnetic layer.

16. The method of claim 14, where the first reference direction is orthogonal to the second reference direction, and where applying the orienting field substantially parallel to the substrate comprises applying the orienting field at an angle that is offset 45 degrees from both the first reference direction and the second reference direction.

* * * * *